(12) United States Patent
Kim et al.

(10) Patent No.: US 10,958,243 B2
(45) Date of Patent: Mar. 23, 2021

(54) FILTER INCLUDING BULK-ACOUSTIC WAVE RESONATOR

(71) Applicant: Samsung Electro-Mechanics Co., Ltd., Suwon-si (KR)

(72) Inventors: Sung-Tae Kim, Suwon-si (KR); Chang Hyun Kim, Suwon-si (KR); Jung Woo Sung, Suwon-si (KR); Yoon Sok Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 22 days.

(21) Appl. No.: 16/386,589

(22) Filed: Apr. 17, 2019

(65) Prior Publication Data
US 2020/0119716 A1 Apr. 16, 2020

(30) Foreign Application Priority Data
Oct. 12, 2018 (KR) .......... 10-2018-0121779

(51) Int. Cl.
*H03H 9/56* (2006.01)
*H03H 9/54* (2006.01)
*H03H 9/60* (2006.01)
*H01Q 1/24* (2006.01)

(52) U.S. Cl.
CPC ............ *H03H 9/566* (2013.01); *H01Q 1/242* (2013.01); *H03H 9/542* (2013.01); *H03H 9/547* (2013.01); *H03H 9/568* (2013.01); *H03H 9/605* (2013.01)

(58) Field of Classification Search
CPC ........ H03H 9/566; H03H 9/542; H03H 9/568; H03H 9/605; H03H 9/547; H01Q 1/242

USPC ................................ 333/133, 186, 187, 188
See application file for complete search history.

(56) References Cited

U.S. PATENT DOCUMENTS

| 7,548,140 | B2 | 6/2009 | Jamneala et al. |
| 2008/0007369 | A1* | 1/2008 | Barber ............... H03H 9/02086 333/189 |
| 2008/0081398 | A1 | 4/2008 | Lee et al. |
| 2008/0252398 | A1 | 10/2008 | Jamneala et al. |
| 2017/0214388 | A1 | 7/2017 | Irieda et al. |
| 2017/0272057 | A1 | 9/2017 | Takata |

FOREIGN PATENT DOCUMENTS

| JP | 2009-10932 A | 1/2009 |
| JP | 4793941 B2 | 10/2011 |
| JP | 2017-135463 A | 8/2017 |
| KR | 10-2017-0080649 A | 7/2017 |

OTHER PUBLICATIONS

Korean Office Action dated Nov. 26, 2019 in counterpart Korean Patent Application No. 10-2018-0121779 (7 pages in English and 6 pages in Korean).

* cited by examiner

*Primary Examiner* — Robert J Pascal
*Assistant Examiner* — Jorge L Salazar, Jr.
(74) *Attorney, Agent, or Firm* — NSIP Law (57) ABSTRACT

A filter includes a plurality of series portions each including one or more series resonators, and a plurality of shunt portions each including one or more shunt resonators. At least one of the plurality of shunt portions includes two shunt resonators connected to each other in anti-series, and anti-resonance frequencies of the two shunt resonators are arranged externally of a passband.

20 Claims, 7 Drawing Sheets

FILTER INCLUDING BULK-ACOUSTIC WAVE RESONATOR

CROSS-REFERENCE TO RELATED APPLICATIONS

This application claims the benefit under 35 USC 119(a) of Korean Patent Application No. 10-2018-0121779 filed on Oct. 12, 2018, in the Korean Intellectual Property Office, the entire disclosure of which is herein incorporated by reference for all purposes.

BACKGROUND

1. Field

This application relates to a filter including a bulk-acoustic wave resonator.

2. Description of the Background

Recently, with the rapid development of mobile communication devices, chemical and biological devices, and the like, demand for a small-sized lightweight filter, an oscillator, a resonant element, an acoustic resonant mass sensor, and the like, used in such devices, has increased.

Generally, a film bulk acoustic resonator (FBAR) has been used as a means for implementing a small-sized lightweight filter, an oscillator, a resonant element, an acoustic resonant mass sensor, and the like. A film bulk acoustic resonator may be mass produced at a significantly low cost, and a microsized film bulk acoustic resonator may be implemented. Also, a film bulk acoustic resonator may implement a high quality factor (Q), one of the main properties of a filter, and may be used in a variety of GHz frequency bands.

Generally, a bulk-acoustic wave resonator may include a resonance portion implemented by stacking a first electrode, a piezoelectric layer, and a second electrode on a substrate. With regard to operational principles of a bulk-acoustic wave resonator, an electric field is induced in a piezoelectric layer by electrical energy applied to first and second electrodes, and a piezoelectric effect occurs in the piezoelectric layer by the induced electric field, such that a resonator may vibrate in a certain direction. As a result, bulk acoustic waves may be generated in the same direction as the vibration direction, and resonance may occur.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a filter includes a plurality of series portions each including one or more series resonators, and a plurality of shunt portions each including one or more shunt resonators. At least one of the plurality of shunt portions includes two shunt resonators connected to each other in anti-series, and antiresonance frequencies of the two shunt resonators are arranged externally of a passband.

The antiresonance frequencies of the two shunt resonators connected to each other in anti-series may be the same as antiresonance frequencies of the one or more series resonators.

The antiresonance frequencies of the two shunt resonators connected to each other in anti-series may be different from antiresonance frequencies of the one or more shunt resonators included in the other shunt portions of the plurality of shunt portions.

Resonance frequencies of the two shunt resonators connected to each other in anti-series may be the same as resonance frequencies of the one or more series resonators.

The resonance frequencies of the two shunt resonators connected to each other in anti-series may be different from resonance frequencies of the one or more shunt resonators included in the other shunt portions of the plurality of shunt portions.

The at least one shunt portion may further include a trimming inductor disposed between the two shunt resonators connected to each other in anti-series and a ground.

In another general aspect, a filter includes a first series resonator, a second series resonator, and a third series resonator disposed in order between a first terminal and a second terminal, and a first shunt resonator disposed between a first node and a ground between the first series resonator and the second series resonator, and a second shunt resonator disposed between a second node and a ground between the second series resonator and the third series resonator. The first shunt resonator includes a 1-1 shunt resonator and a 1-2 shunt resonator connected to each other in anti-series, and antiresonance frequencies of the 1-1 shunt resonator and the 1-2 shunt resonator are positioned at one of attenuation poles defining a passband.

The antiresonance frequencies of the 1-1 shunt resonator and the 1-2 shunt resonator may be the same as antiresonance frequencies of the first series resonator, the second series resonator, and the third series resonator.

Resonance frequencies of the 1-1 shunt resonator and the 1-2 shunt resonator may be the same as resonance frequencies of the first series resonator, the second series resonator, and the third series resonator.

The filter may further include a trimming inductor disposed between the 1-1 shunt resonator and the 1-2 shunt resonator, and a ground, wherein resonance frequencies of the 1-1 shunt resonator and the 1-2 shunt resonator may be positioned at the other one of the attenuation poles defining the passband due to the trimming inductor.

The second series resonator may include a 2-1 shunt resonator and a 2-2 shunt resonator connected to each other in anti-series.

Resonance frequencies and antiresonance frequencies of the 2-1 shunt resonator and the 2-2 shunt resonator may be the same as resonance frequencies and antiresonance frequencies of the first series resonator, the second series resonator, and the third series resonator.

The filter may further include a 3-1 shunt resonator and a 3-2 shunt resonator disposed between the first terminal and a ground and connected to each other in anti-series.

Resonance frequencies and antiresonance frequencies of the 3-1 shunt resonator and the 3-2 shunt resonator may be the same as resonance frequencies and antiresonance frequencies of the first series resonator, the second series resonator, and the third series resonator.

The filter may further include one or more additional series resonators disposed in order between the third series resonator and the second terminal, and one or more shunt resonators disposed between additional nodes and a ground between respective ones of the third series resonator and the one or more additional series resonators.

The filter may further include a third shunt resonator disposed between a third node and a ground between the third series resonator and the second terminal.

An antenna may be connected to the first terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example, for example, as to what an example may include or implement, means that at least one example exists in which such a feature is included or implemented while all examples are not limited thereto.

An aspect of the present disclosure is to provide a filter which may reduce insertion loss and secondary harmonic distortion.

Figure 1A:
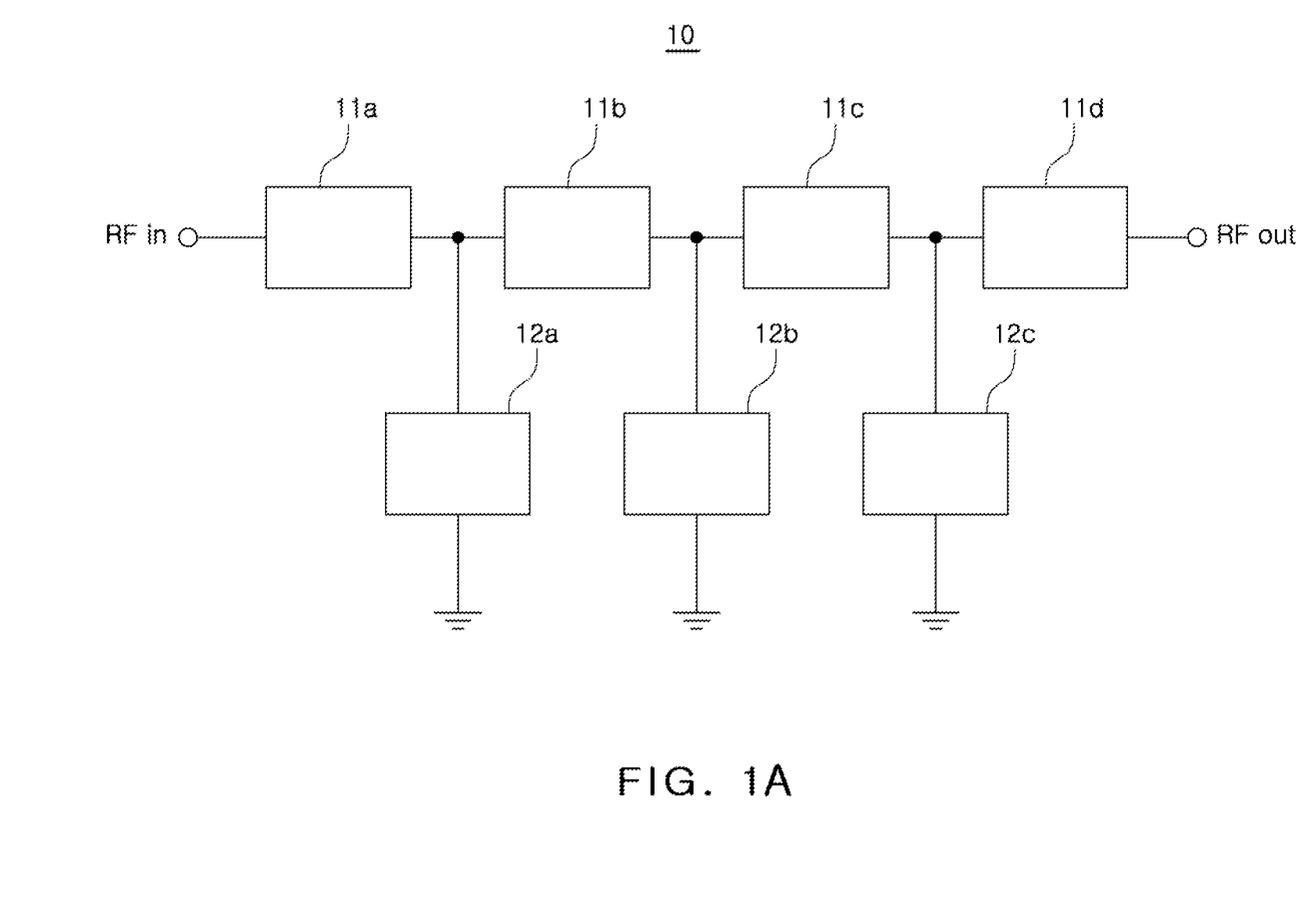
FIG. 1A is an example circuit diagram illustrating an example filter according to one or more examples of the present disclosure.

FIG. 1A is an example circuit diagram illustrating an example filter according to one or more examples.

Referring to FIG. 1A, a filter 10 may include a plurality of series portions 11a, 11b, 11c, and 11d, and a plurality of shunt portions 12a, 12b, and 12c disposed between respective ones of the plurality of series portions 11a, 11b, 11c, and 11d and a ground. The filter 10 may have a ladder-type filter structure, or alternatively, the filter may have a lattice-type filter structure.

The plurality of series portions 11a, 11b, 11c, and 11d may be disposed in series between a signal input terminal RFin receiving an input signal, and a signal output terminal RFout outputting an output signal. The plurality of shunt portions 12a, 12b, and 12c may be disposed between a node and respective ones of the plurality of series portions 11a, 11b, 11c, and 11d and a ground. In example embodiments, the shunt portion may also be disposed between the signal input terminal RFin and a ground, or between the signal output terminal RFout and a ground.

FIG. 1A illustrates an example in which the filter 10 includes four series portions 11a, 11b, 11c, and 11d and three shunt portions 12a, 12b, and 12c, but the number of the series portions 11a, 11b, 11c, and 11d and the number of the shunt portions 12a, 12b, and 12c may vary.

The plurality of series portions 11a, 11b, 11c, and 11d and the plurality of shunt portions 12a, 12b, and 12c each may include at least one bulk-acoustic wave resonator.

Figure 1B:
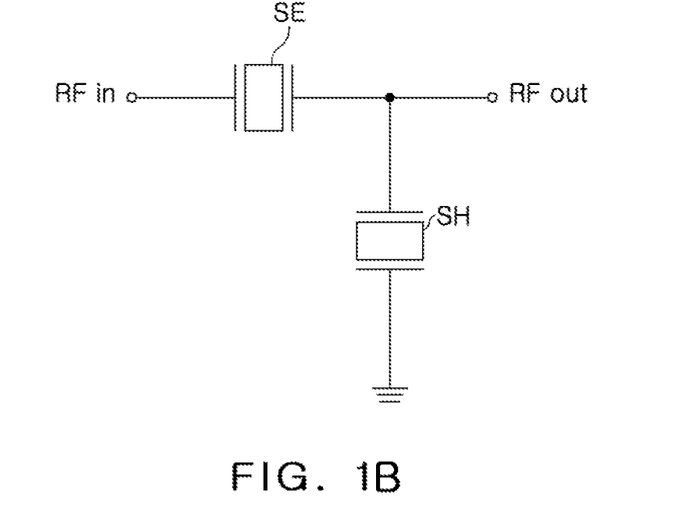
FIG. 1B is an example circuit diagram illustrating an example filter including a bulk-acoustic wave resonator.
Figure 1C:
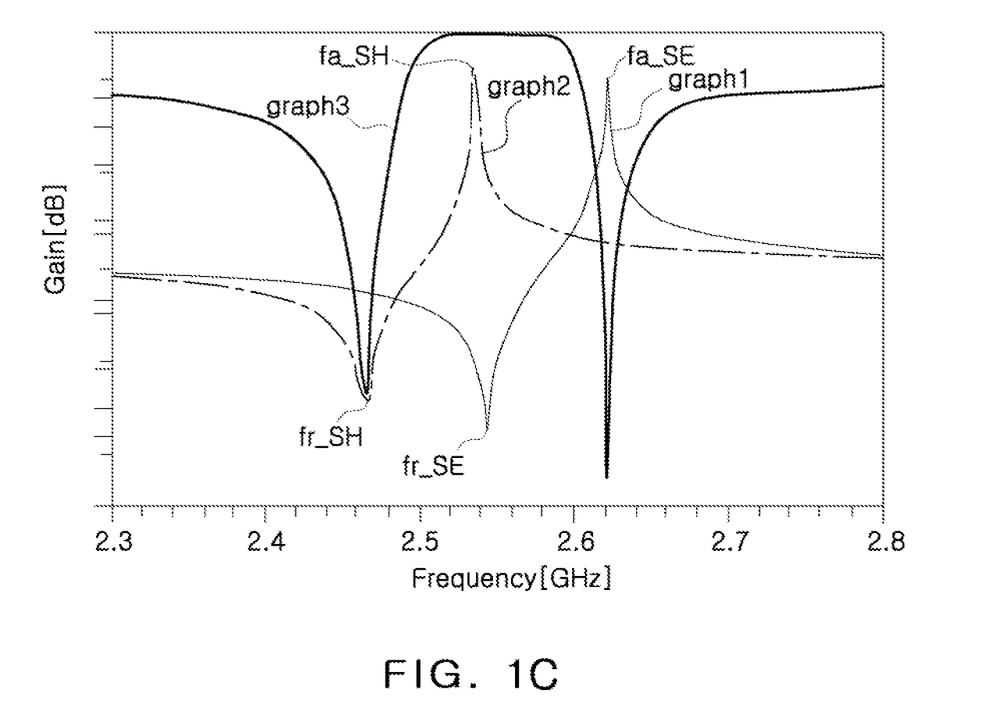
FIG. 1C is a graph illustrating a frequency response of an example filter illustrated in FIG. 1B.

FIG. 1B is an example circuit diagram illustrating an example filter including a bulk-acoustic wave resonator, and FIG. 10 is a graph illustrating a frequency response of an example filter illustrated in FIG. 1B.

Referring to FIG. 1B, a filter may include a series resonator SE disposed between a signal input terminal RFin and a signal output terminal RFout, and a shunt resonator SH disposed between the series resonator SE and a ground.

Referring to FIG. 1C, a first graph (graph1) represents a frequency response (Z, impedance) obtained by using the series resonator SE, a second graph (graph2) represents a frequency response (Z, impedance) obtained by using the shunt resonator SH, and a third graph (graph3) represents a frequency response (S-parameter) obtained by using the filter including the series resonator SE and the shunt resonator SH.

A frequency response obtained by using the series resonator SE may have a resonance frequency (fr_SE) and an antiresonance frequency (fa_SE), and a frequency response obtained by using the shunt resonator SH may have a resonance frequency (fr_SH) and an antiresonance frequency (fa_SH). Referring to the frequency response of the filter, a bandwidth of the filter may be determined depending on the antiresonance frequency (fa_SE) of the series resonator SE and the resonance frequency (fr_SH) of the shunt resonator SH.

Figure 2:
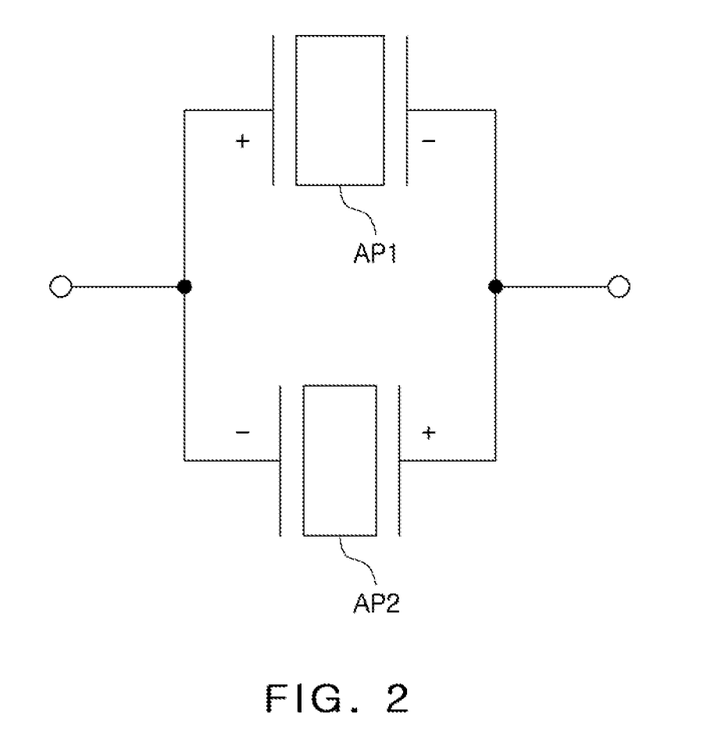
FIG. 2 is an example circuit diagram illustrating example bulk-acoustic wave resonators connected to each other in anti-parallel.
Figure 3:
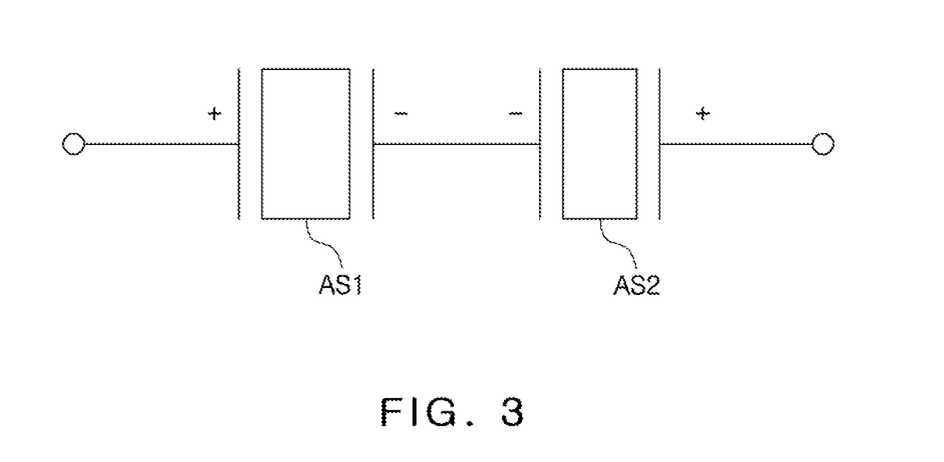
FIG. 3 is an example circuit diagram illustrating example bulk-acoustic wave resonators connected to each other in anti-series.

FIG. 2 is an example circuit diagram illustrating example bulk-acoustic wave resonators connected to each other in anti-parallel, and FIG. 3 is an example circuit diagram illustrating example bulk-acoustic wave resonators connected to each other in anti-series.

Referring to FIGS. 2 and 3, two bulk-acoustic wave resonators AP1 and AP2 illustrated in FIG. 2 may be connected to each other in anti-parallel, and two bulk-acoustic wave resonators AS1 and AS2 illustrated in FIG. 3 may be connected to each other in anti-series. The anti-parallel connection may indicate that polarities of two bulk-acoustic wave resonators are connected in parallel in opposite directions, and the anti-series connection may indicate that polarities of two bulk-acoustic wave resonators are connected in series in opposite directions.

When a wireless frequency signal is applied to the bulk-acoustic wave resonators illustrated in FIGS. 2 and 3, polarities of the two bulk-acoustic wave resonators may be connected to each other in parallel or in series in opposite directions such that a vibration state of one of the two bulk-acoustic wave resonators may be different from a vibration state of the other. For example, when one of the bulk-acoustic wave resonators is in an expansion state, the other bulk-acoustic wave resonator may be in a contraction state. Accordingly, due to the opposite stimulation states of the two bulk-acoustic wave resonators, nonlinear properties of each of the bulk-acoustic wave resonators may be cancelled out by the other.

Recently, with the rapid increase in consumption and development of wireless frequency communications, an interval between bands have been decreased to efficiently use limited frequency resources. Accordingly, there has been demand for a technique to minimize interference from other bands.

In the case of a wireless frequency filter used for wireless terminal devices, insertion loss properties may need to be resolved to minimize interference from other bands. In the case of a filter using a bulk-acoustic wave resonator, the same bulk-acoustic wave resonators having opposite polarities may be connected to each other in anti-parallel or in anti-series to resolve insertion loss, thereby minimizing interference from other bands.

To resolve the insertion loss, when a bulk-acoustic wave resonator connected to a shunt portion in anti-series is applied, 2nd harmonic distortion (2HD) may occur in anti-resonance frequencies of the bulk-acoustic wave resonators connected to each other in anti-series, and as a result, 2nd harmonic distortion may occur in a passband.

Also, to efficiently resolve the insertion loss properties, it may be necessary to apply a bulk-acoustic wave resonator connected to a shunt portion adjacent to an antenna terminal in anti-series. However, when a bulk-acoustic wave resonator connected to a shunt portion adjacent to an antenna terminal of a filter in anti-series is applied, 2nd harmonic distortion may occur more excessively.

In a filter in the examples described herein, an antiresonance frequency of a bulk-acoustic wave resonator applied in a shunt portion and connected in anti-series may be configured to be arranged externally of a passband such that 2nd harmonic distortion occurring in a passband may be prevented.

FIGS. 4 to 9 are example circuit diagrams illustrating an example filter according to one or more examples.

In the descriptions below, an example embodiment illustrated in FIG. 4 will be described, and differences between the example embodiment illustrated in FIG. 4 and example embodiments illustrated in FIGS. 5 to 9 will be described while minimizing overlapping descriptions.

Figure 4:
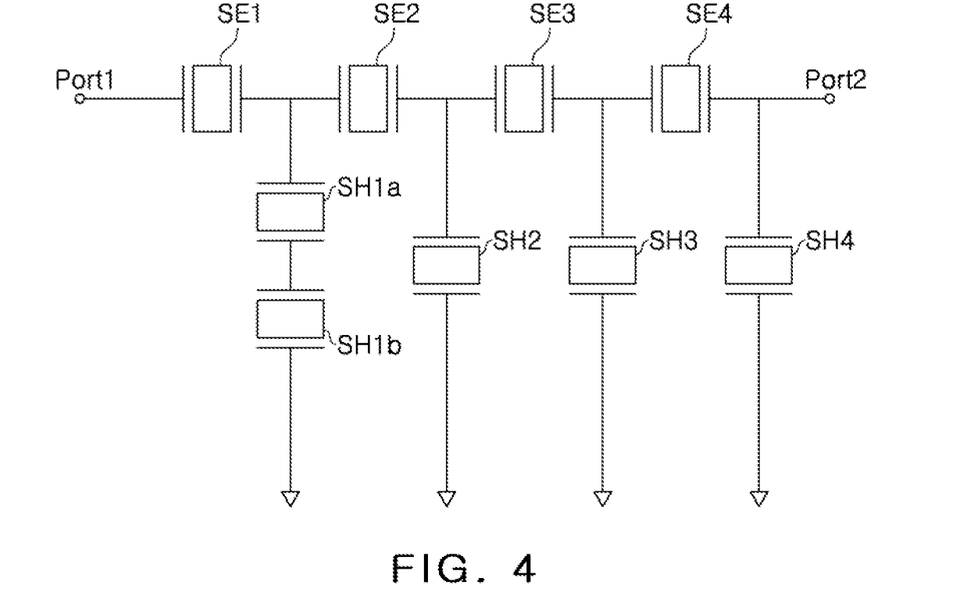
FIGS. 4, 5, 6, 7, 8, and 9 are example circuit diagrams illustrating an example filter according to one or more examples of the present disclosure.

Referring to FIG. 4, a filter in the example embodiment may include a first series resonator SE1, a second series resonator SE2, a third series resonator SE3, and a fourth series resonator SE4 disposed between a first terminal port1 and a second terminal port2, and may further include a 1-1 shunt resonator SH1a and a 1-2 shunt resonator SH1b disposed between a node and a ground between the first series resonator SE1 and the second series resonator SE2, a second shunt resonator SH2 disposed between a node and a ground between the second series resonator SE2 and the third series resonator SE3, a third shunt resonator SH3 disposed between a node and a ground between the third series resonator SE3 and the fourth series resonator SE4, and a fourth shunt resonator SH4 disposed between the fourth series resonator SE4 and the second terminal port2.

In FIG. 4, an antenna may be connected to one of the first terminal port1 and the second terminal port2, and a transmitter circuit may be connected to the other. In the description below, it will be presumed that an antenna may be connected to the first terminal port1, and the transmitter circuit may be connected to the second terminal port2.

The 1-1 shunt resonator SH1a and the 1-2 shunt resonator SH1b disposed between a node and a ground between the first series resonator SE1 and the second series resonator SE2 may be connected to each other in anti-series.

According to the example embodiment, by disposing the 1-1 shunt resonator SH1a and the 1-2 shunt resonator SH1b connected to each other in anti-series adjacently to the first terminal port1 to which an antenna is connected, insertion loss may be resolved.

The first series resonator SE1, the second series resonator SE2, the third series resonator SE3, and the fourth series resonator SE4 may have the same resonance frequency and the same antiresonance frequency. The second shunt resonator SH2, the third shunt resonator SH3, and the fourth shunt resonator SH4 may have the same resonance frequency and the same antiresonance frequency.

The antiresonance frequencies of the 1-1 shunt resonator SH1a and the 1-2 shunt resonator SH1b connected to each other in anti-series may be different from the antiresonance frequencies of the second shunt resonator SH2, the third shunt resonator SH3, and the fourth shunt resonator SH4.

The antiresonance frequencies of the 1-1 shunt resonator SH1a and the 1-2 shunt resonator SH1b connected to each other in anti-series may be arranged on a right side of a passband of the filter, differently from the antiresonance frequencies of the second shunt resonator SH2, the third shunt resonator SH3, and the fourth shunt resonator SH4. For example, the antiresonance frequencies of the 1-1 shunt resonator SH1a and the 1-2 shunt resonator SH1b may be the same as the antiresonance frequencies of the first series resonator SE1, the second series resonator SE2, the third series resonator SE3, and the fourth series resonator SE4.

According to the example embodiment, by disposing the 1-1 shunt resonator SH1a and the 1-2 shunt resonator SH1b connected to each other in anti-series adjacently to the first terminal port1 to which an antenna is connected, and by configuring the antiresonance frequencies of the 1-1 shunt resonator SH1a and the 1-2 shunt resonator SH1b connected to each other in anti-series to be the same as the antiresonance frequencies of the series resonators, insertion loss may be resolved, and 2nd harmonic distortion occurring in a passband may be prevented.

Also, by configuring the antiresonance frequencies of the 1-1 shunt resonator SH1a and the 1-2 shunt resonator SH1b connected to each other in anti-series to be the same as the antiresonance frequencies of the series resonators, the antiresonance frequencies of the 1-1 shunt resonator SH1a and the 1-2 shunt resonator SH1b connected to each other in anti-series may be disposed at one of attenuation poles defining a passband, and accordingly, a skirt of passband may be formed in a rapid manner such that filtering properties may improve.

Resonance frequencies of the 1-1 shunt resonator SH1a and the 1-2 shunt resonator may be the same as resonance frequencies of the first series resonator SE1, the second series resonator SE2, the third series resonator SE3, and the fourth series resonator SE4. The resonance frequencies of the 1-1 shunt resonator SH1a and the 1-2 shunt resonator SH1b may be different from resonance frequencies of the other shunt resonators.

A resonance frequency and an antiresonance frequency of the bulk-acoustic wave resonator may be determined depending on thicknesses of a plurality of layers included in the bulk-acoustic wave resonator. As an example, a resonance frequency and an antiresonance frequency of the bulk-acoustic wave resonator may be determined depending on a thickness of a piezoelectric layer.

Thus, when the plurality of resonators included in a filter have different resonance frequencies and different antiresonance frequencies, thicknesses of layers in the resonators having different resonance frequencies and different antiresonance frequencies may need to be different. When thicknesses of layers of the plurality of resonators are designed to be different from each other, however, a plurality of processes may be necessary, which may degrade process yield.

According to the example embodiment, the filter may include bulk-acoustic wave resonators having two resonance frequencies and antiresonance frequencies different from each other, thereby facilitating design of the filter.

Figure 5:
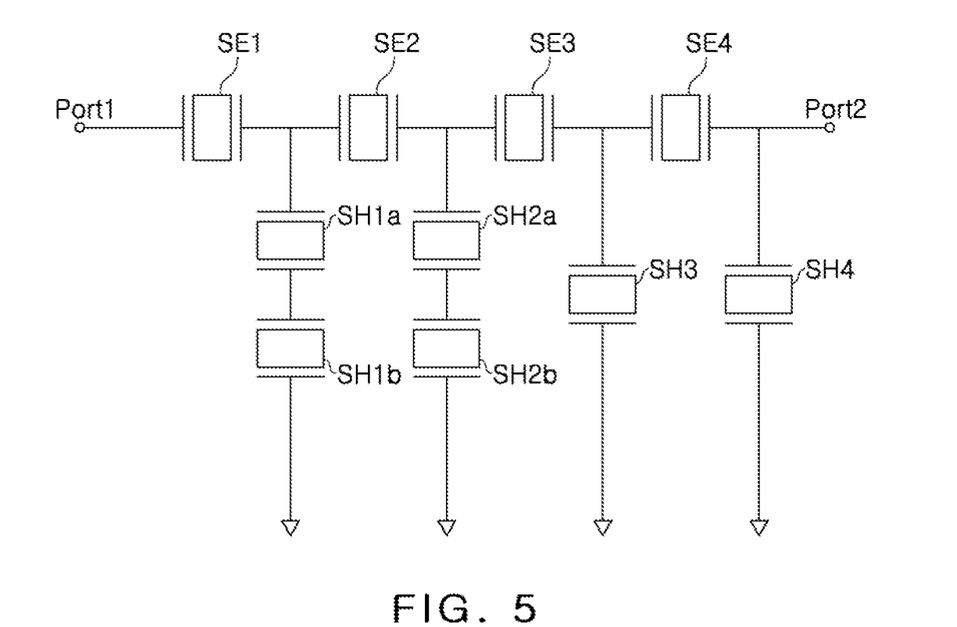

Referring to FIG. 5, differently from the example embodiment in FIG. 4, a 2-1 shunt resonator SH2a and a 2-2 shunt resonator SH2b may be disposed in series between a node and a ground between a second series resonator SE2 and a third series resonator SE3.

In other words, the second shunt resonator SH2 in the example embodiment in FIG. 4 may be replaced with the 2-1 shunt resonator SH2a and the 2-2 shunt resonator SH2b in the example embodiment illustrated in FIG. 5. As an example, the second shunt resonator SH2 in the example embodiment illustrated in FIG. 4 may include the 2-1 shunt resonator SH2a and the 2-2 shunt resonator SH2b in the example embodiment illustrated in FIG. 5.

The 2-1 shunt resonator SH2a and the 2-2 shunt resonator SH2b disposed between a node and a ground between the second series resonator SE2 and the third series resonator SE3 may be connected to each other in anti-series.

Resonance frequencies and antiresonance frequencies of the 2-2 shunt resonator SH2a and the 2-2 shunt resonator SH2b connected to each other in anti-series may be the same as the resonance frequencies and the antiresonance frequencies of the first series resonator SE1, the second series resonator SE2, the third series resonator SE3, and the fourth series resonator SE4, similarly to the 1-1 shunt resonator SH1a and the 1-2 shunt resonator SH1b.

Figure 6:
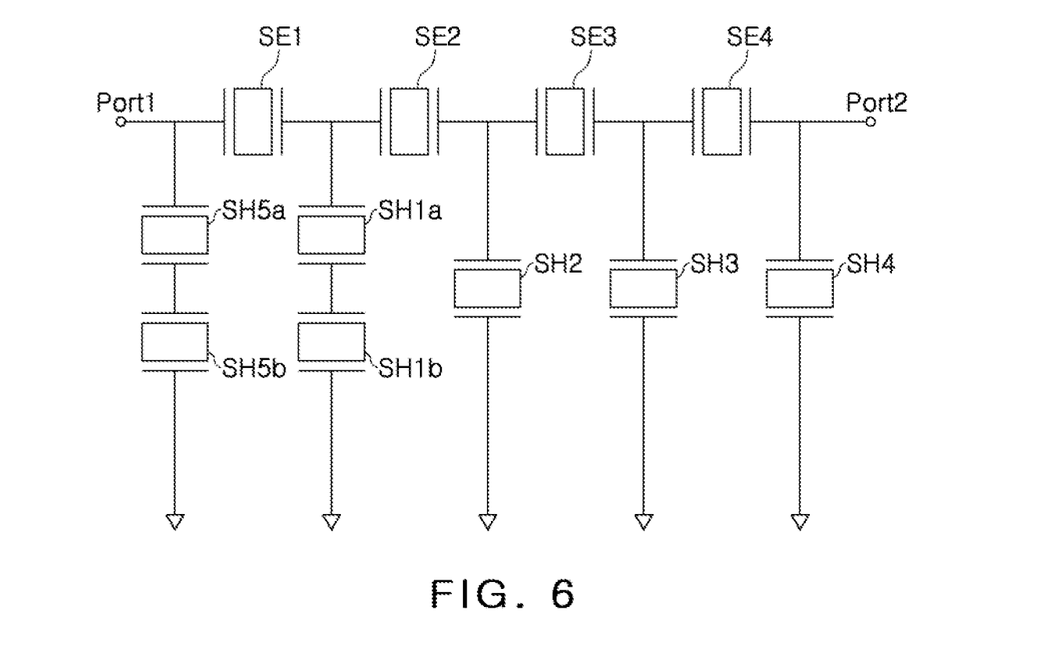

Referring to FIG. 6, differently from the example embodiment illustrated in FIG. 4, a 5-1 shunt resonator SH5a and a 5-2 shunt resonator SH5b may be disposed in series between a node and a ground between a first terminal port1 and a first series resonator SE1.

The 5-1 shunt resonator SH5a and the 5-2 shunt resonator SH5b disposed between a node and a ground between the first terminal port1 and the first series resonator SE1 may be connected to each other in anti-series.

Resonance frequencies and antiresonance frequencies of the 5-1 shunt resonator SH5a and the 5-2 shunt resonator SH5b connected to each other in anti-series may be the same as resonance frequencies and antiresonance frequencies of a first series resonator SE1, a second series resonator SE2, a third series resonator SE3, and a fourth series resonator SE4, similarly to a 1-1 shunt resonator SH1a and a 1-2 shunt resonator SH1b.

According to the example embodiment, by arranging the 5-1 shunt resonator SH5a and the 5-2 shunt resonator SH5b directly connected to the first terminal port1 connected to an antenna, and by configuring the antiresonance frequencies of the 5-1 shunt resonator SH5a and the 5-2 shunt resonator SH5b connected to each other in anti-series to be the same as the antiresonance frequencies of the series resonators, insertion loss may be resolved, and 2nd harmonic distortion occurring in a passband may be prevented.

Figure 7:
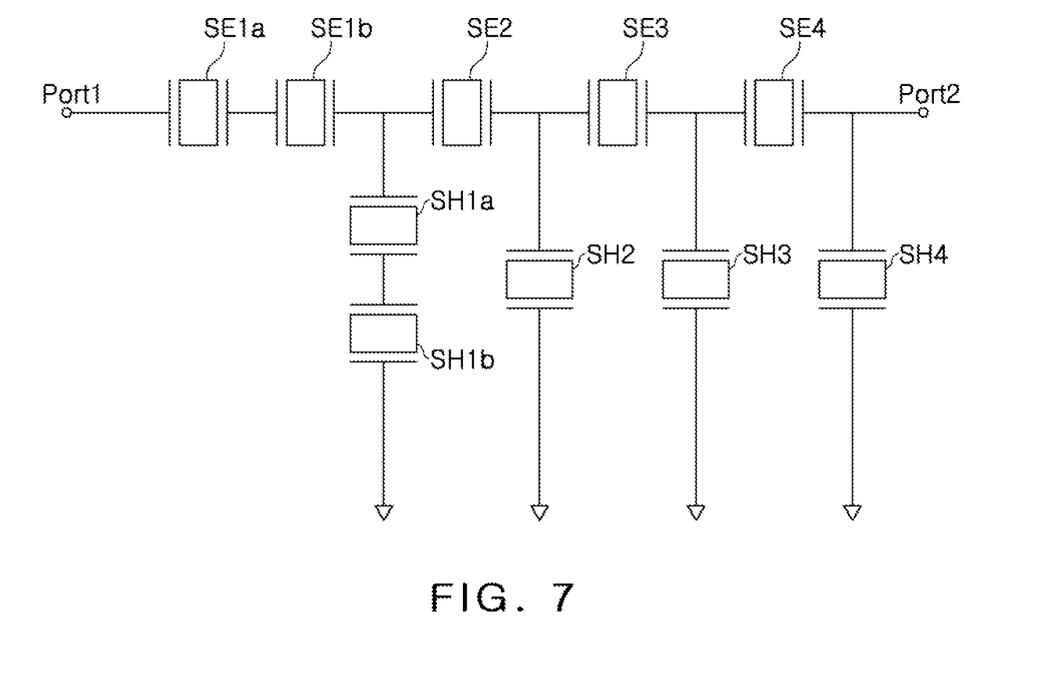

Referring to FIG. 7, differently from the example embodiment illustrated in FIG. 4, a 1-1 series resonator SE1a and a 1-2 series resonator SE1b may be disposed in series between a first terminal port1 and a node between a second series resonator SE2 and a 1-1 shunt resonator SH1a.

In other words, the first series resonator SE1 in the example embodiment illustrated in FIG. 4 may be replaced with the 1-1 series resonator SE1a and the 1-2 series resonator SE1b in the example embodiment illustrated in FIG. 7. As an example, the first series resonator SE1 in the example embodiment illustrated in FIG. 4 may include the 1-1 series resonator SE1a and the 1-2 series resonator SE1b in the example embodiment illustrated in FIG. 7.

The 1-1 series resonator SE1a and the 1-2 series resonator SE1b disposed between the first terminal port1 and the node between the second series resonator SE2 and the 1-1 shunt resonator SH1a may be connected to each other in anti-series.

Figure 8:
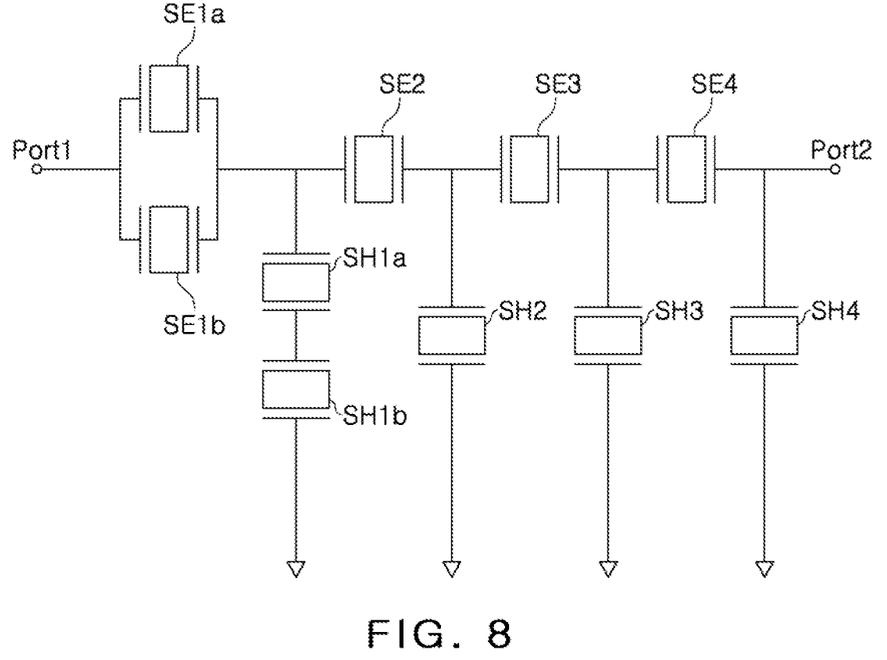

Referring to FIG. 8, differently from the example embodiment illustrated in FIG. 4, a 1-1 series resonator SE1a and a 1-2 series resonator SE1b may be disposed in parallel between a first terminal port1 and a node between a second series resonator SE2 and a 1-1 shunt resonator SH1a.

In other words, the first series resonator SE1 in the example embodiment illustrated in FIG. 4 may be replaced with the 1-1 series resonator SE1a and the 1-2 series resonator SE1b in the example embodiment illustrated in FIG. 8. As an example, the first series resonator SE1 in the example embodiment illustrated in FIG. 4 may include the 1-1 series resonator SE1a and the 1-2 series resonator SE1b in the example embodiment in FIG. 8.

The 1-1 series resonator SE1a and the 1-2 series resonator SE1b disposed between a first terminal port1 and a node between the second series resonator SE2 and the 1-1 shunt resonator SH1a may be connected to each other in anti-parallel.

As described in the example embodiment above, resonance frequencies of the 1-1 shunt resonator SH1a and the 1-2 shunt resonator SH1b, resonance frequencies of the 2-1 shunt resonator SH2a and the 2-2 shunt resonator SH2b, and resonance frequencies of the 5-1 shunt resonator SH5a and the 5-2 shunt resonator SH5b, respectively connected to each other in anti-series, may be the same as the resonance frequencies of the series resonators.

When the resonance frequencies of the shunt resonators connected to each other in anti-series are the same as the resonance frequencies of the series resonators, a quality factor of a passband may degrade slightly.

According to the example embodiment, by disposing a trimming inductor between shunt resonators connected to each other in anti-series and a ground, resonance frequencies of the shunt resonators connected to each other in anti-series may be positioned in resonance frequency bands of the other resonators, thereby improving a quality factor of the filter.

Figure 9:
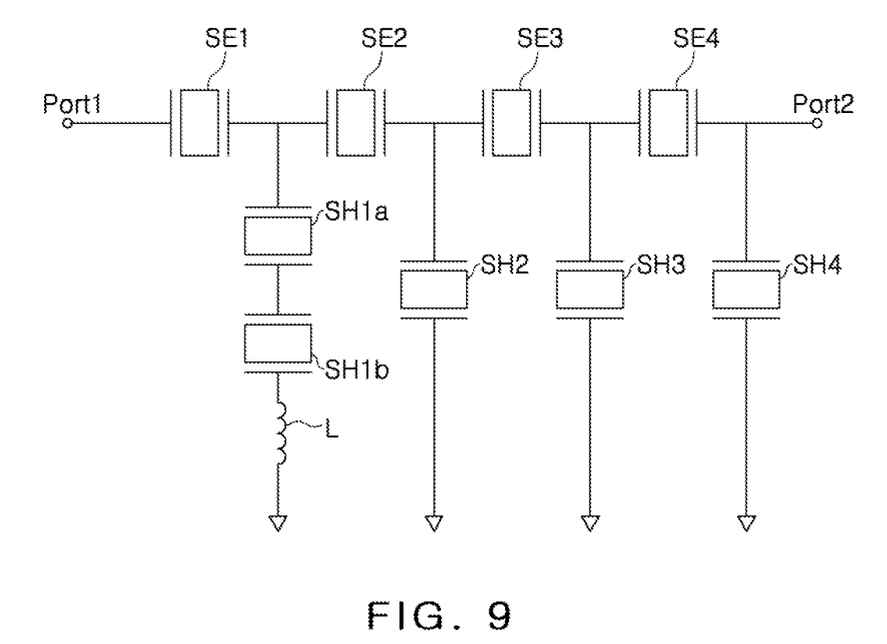

Referring to FIG. 9, differently from the example embodiment in FIG. 4, a trimming inductor L may be disposed between a 1-2 shunt resonator SH1b and a ground. As the trimming inductor L is disposed between the 1-2 shunt resonator SH1b and a ground, a quality factor may improve in a bandwidth.

Figure 10:
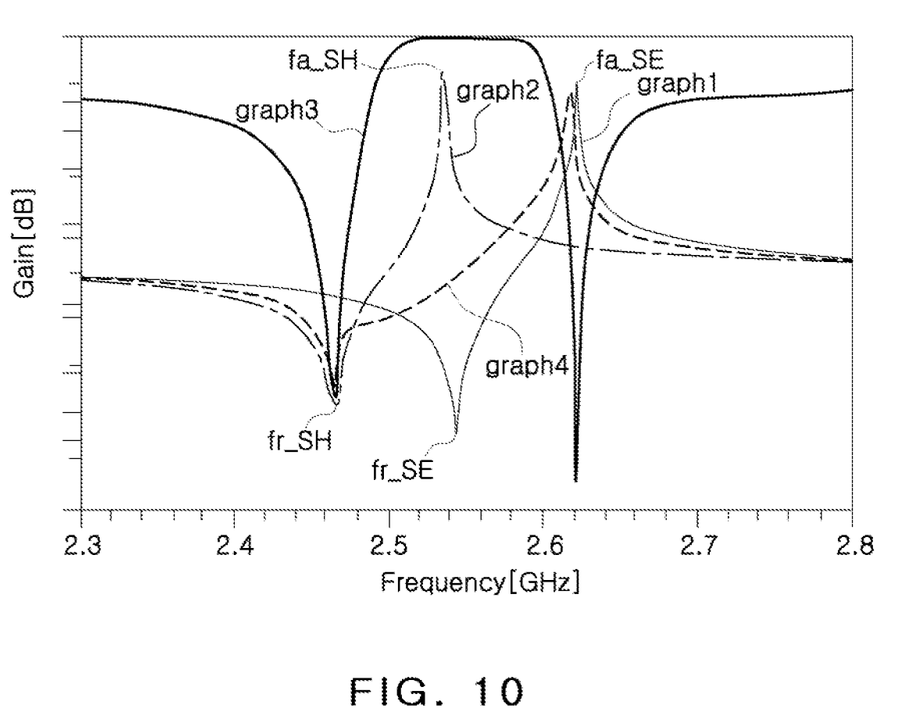
FIG. 10 is a graph illustrating a frequency response of an example filter illustrated in FIG. 9.

FIG. 10 is a graph illustrating a frequency response of an example filter illustrated in FIG. 9.

Referring to FIG. 10, a first graph (graph1) illustrates a frequency response obtained by using series resonators SE1, SE2, SE3, and SE4, a second graph (graph2) illustrates a frequency response obtained by using shunt resonators SH2, SH3, and SH4 other than shunt resonators SH1a and SH1b connected to each other in anti-series, a third graph (graph3) illustrates a frequency response obtained by using a filter including series resonators SE and shunt resonators SH, and a fourth graph (graph4) illustrates a frequency response obtained by using shunt resonators SH1a and SH1b connected to each other in anti-series and a trimming inductor L.

Referring to FIG. 10, antiresonance frequencies of the shunt resonators SH1a and SH1b connected to each other in anti-series may be the same as antiresonance frequencies of the series resonators SE1, SE2, SE3, and SE4, and resonance frequencies of the shunt resonators SH1a and SH1b connected to each other in anti-series may be configured to be the same as resonance frequencies of the other shunt resonators SH2, SH3, and SH4 due to the trimming inductor L such that the resonance frequencies may be positioned at the other one of attenuation poles defining a passband, thereby improving a quality factor of the filter.

According to the examples described herein, the filter in the example embodiments may reduce insertion loss and 2nd harmonic distortion.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A filter comprising:
    a plurality of series portions each comprising one or more series resonators; and
    a plurality of shunt portions each comprising one or more shunt resonators,
    wherein at least one of the plurality of shunt portions comprises two shunt resonators connected to each other in anti-series, and
    antiresonance frequencies of the two shunt resonators are arranged outside a passband of the filter.

2. The filter of claim 1, wherein the antiresonance frequencies of the two shunt resonators connected to each other in anti-series are the same as antiresonance frequencies of the one or more series resonators.

3. The filter of claim 2, wherein the antiresonance frequencies of the two shunt resonators connected to each other in anti-series are different from antiresonance frequencies of the one or more shunt resonators included in other shunt portions of the plurality of shunt portions.

4. The filter of claim 1, wherein resonance frequencies of the two shunt resonators connected to each other in anti-series are the same as resonance frequencies of the one or more series resonators.

5. The filter of claim 4, wherein the resonance frequencies of the two shunt resonators connected to each other in anti-series are different from resonance frequencies of the one or more shunt resonators included in other shunt portions of the plurality of shunt portions.

6. The filter of claim 1, wherein the at least one shunt portion further comprises a trimming inductor disposed between the two shunt resonators connected to each other in anti-series and a ground.

7. The filter of claim 1, wherein the antiresonance frequencies of the two shunt resonators are positioned at one of attenuation poles defining the passband of the filter.

8. The filter of claim 1, wherein one of the plurality of series portions comprises two series resonators connected to each other in anti-series.

9. The filter of claim 1, wherein one of the plurality of series portions comprises two series resonators connected to each other in anti-parallel.

10. A filter comprising:
a first series resonator, a second series resonator, and a third series resonator connected in series between a first terminal and a second terminal, the first series resonator being connected to the second series resonator at a first node, and the second series resonator being connected to the third series resonator at a second node;
a first shunt resonator connected between the first node and a ground; and
a second shunt resonator connected between the second node and the ground,
wherein the first shunt resonator comprises a 1-1 shunt resonator and a 1-2 shunt resonator connected to each other in anti-series between the first node and the ground, and
antiresonance frequencies of the 1-1 shunt resonator and the 1-2 shunt resonator are positioned at one of attenuation poles defining a passband of the filter.

11. The filter of claim 10, wherein the antiresonance frequencies of the 1-1 shunt resonator and the 1-2 shunt resonator are the same as antiresonance frequencies of the first series resonator, the second series resonator, and the third series resonator.

12. The filter of claim 10, wherein resonance frequencies of the 1-1 shunt resonator and the 1-2 shunt resonator are the same as resonance frequencies of the first series resonator, the second series resonator, and the third series resonator.

13. The filter of claim 12, further comprising a trimming inductor disposed between the 1-1 shunt resonator and the 1-2 shunt connected to each other in anti-series and the ground,
wherein the trimming inductor causes the resonance frequencies of the 1-1 shunt resonator and the 1-2 shunt resonator to be positioned at another one of the attenuation poles defining the passband of the filter.

14. The filter of claim 10, wherein the second series resonator comprises a 2-1 shunt resonator and a 2-2 shunt resonator connected to each other in anti-series between the second node and the ground.

15. The filter of claim 14, wherein resonance frequencies and antiresonance frequencies of the 2-1 shunt resonator and the 2-2 shunt resonator are the same as resonance frequencies and antiresonance frequencies of the first series resonator, the second series resonator, and the third series resonator.

16. The filter of claim 10, wherein the first terminal is connected to the first series resistor at a third node, and
the filter further comprises a 3-1 shunt resonator and a 3-2 shunt resonator connected to each other in anti-series between the third node and the ground.

17. The filter of claim 16, wherein resonance frequencies and antiresonance frequencies of the 3-1 shunt resonator and the 3-2 shunt resonator are the same as resonance frequencies and antiresonance frequencies of the first series resonator, the second series resonator, and the third series resonator.

18. The filter of claim 10, further comprising:
one or more additional series resonators connected in series between the third series resonator and the second terminal; and
one or more additional shunt resonators respectively connected between one or more additional nodes and the ground,
wherein each one of the third series resonator and the one or more additional series resonators is connected to a next one of the third series resonator and the one or more additional series resonators at a respective one of the one or more additional nodes.

19. The filter of claim 10, wherein the third resonator is connected to a fourth node disposed between the third resonator and the second terminal, and
the filter further comprises a third shunt resonator connected between the third node and the ground.

20. The filter of claim 10, wherein the first terminal is connected to an antenna.

* * * * *